US009768224B2

(12) United States Patent
Hsu et al.

(10) Patent No.: US 9,768,224 B2
(45) Date of Patent: Sep. 19, 2017

(54) IMAGE SENSOR INCLUDING MULTIPLE LENSES AND METHOD OF MANUFACTURE THEREOF

(71) Applicant: Taiwan Semiconductor Manufacturing Company, Ltd., Hsin-Chu (TW)

(72) Inventors: Tzu-Hsuan Hsu, Kaohsiung (TW); Dun-Nian Yaung, Taipei (TW); Yean-Kuen Fang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/638,861

(22) Filed: Mar. 4, 2015

(65) Prior Publication Data

US 2015/0187833 A1 Jul. 2, 2015

Related U.S. Application Data

(60) Division of application No. 14/087,370, filed on Nov. 22, 2013, now Pat. No. 8,987,113, which is a continuation of application No. 10/939,894, filed on Sep. 13, 2004, now abandoned.

(51) Int. Cl.
*H01L 27/146* (2006.01)
(52) U.S. Cl.
CPC .. *H01L 27/14685* (2013.01); *H01L 27/14621* (2013.01); *H01L 27/14625* (2013.01)

(58) Field of Classification Search
CPC ......... H01L 27/14625; H01L 27/14621; H01L 27/14685
See application file for complete search history.

(56) References Cited

U.S. PATENT DOCUMENTS

| 4,721,999 | A | | 1/1988 | Takemura et al. |
| 4,952,525 | A | | 8/1990 | Van der Plas |
| 5,278,105 | A | | 1/1994 | Eden et al. |
| 5,323,052 | A | | 6/1994 | Koyama |
| 5,371,397 | A | | 12/1994 | Maegawa et al. |
| 5,400,072 | A | | 3/1995 | Izumi et al. |
| 5,593,913 | A | * | 1/1997 | Aoki ............... G02B 3/0018 257/E27.133 |
| 5,595,930 | A | | 1/1997 | Baek |
| 5,844,290 | A | | 12/1998 | Furumiya |
| 5,871,653 | A | * | 2/1999 | Ling ............. B29D 11/00278 216/2 |
| 5,986,704 | A | | 11/1999 | Asai et al. |
| 6,030,852 | A | | 2/2000 | Sano et al. |
| 6,066,511 | A | | 5/2000 | Fukusyo |
| 6,168,966 | B1 | | 1/2001 | Fan et al. |
| 6,171,885 | B1 | | 1/2001 | Fan et al. |

(Continued)

*Primary Examiner* — Jarrett Stark
(74) *Attorney, Agent, or Firm* — Haynes & Boone, LLP

(57) ABSTRACT

A method includes fabricating an image sensing element in a substrate. A plurality of inter-metal dielectric (IMD) layers are formed over the substrate. Each IMD layer includes a metal layer and a dielectric layer. A planar top surface of a top IMD layer of the plurality of IMD layers is planarized. A portion of the top IMD layer is then removed to transform a region of the planar top surface to a curved recess. A lens is formed on the top IMD layer and in the curved recess. A color filter layer is disposed over the lens and the image sensing element.

18 Claims, 4 Drawing Sheets

(56) References Cited

U.S. PATENT DOCUMENTS

| | | | |
|---|---|---|---|
| 6,188,094 B1* | 2/2001 | Kochi | H01L 27/14609 257/232 |
| 6,221,687 B1 | 4/2001 | Abramovich | |
| 6,255,640 B1* | 7/2001 | Endo | G02B 5/20 250/208.1 |
| 6,259,083 B1* | 7/2001 | Kimura | H01L 27/14621 216/24 |
| 6,271,103 B1 | 8/2001 | Lee | |
| 6,348,361 B1 | 2/2002 | Lee et al. | |
| 6,362,498 B2 | 3/2002 | Abramovich | |
| 6,379,992 B2* | 4/2002 | Jo | H01L 27/14609 257/E27.132 |
| 6,407,415 B2* | 6/2002 | Lee | H01L 27/14621 257/215 |
| 6,583,438 B1 | 6/2003 | Uchida | |
| 6,624,404 B2* | 9/2003 | Lee | H01L 31/02161 250/208.1 |
| 6,784,014 B2 | 8/2004 | Tanigawa | |
| 6,803,250 B1 | 10/2004 | Yaung et al. | |
| 6,815,787 B1 | 11/2004 | Yaung et al. | |
| 6,821,810 B1* | 11/2004 | Hsiao | H01L 27/14621 257/432 |
| 6,831,311 B2* | 12/2004 | Uchida | G02B 3/0012 257/290 |
| 6,876,049 B2 | 4/2005 | Fan et al. | |
| 6,952,311 B2 | 10/2005 | Sakai | |
| 7,029,944 B1* | 4/2006 | Conley, Jr. | H01L 21/31053 257/E21.244 |
| 7,053,427 B2* | 5/2006 | Tanigawa | H01L 27/14601 257/294 |
| 7,061,028 B2 | 6/2006 | Yaung et al. | |
| 7,064,405 B2 | 6/2006 | Kondo et al. | |
| 7,075,164 B2* | 7/2006 | Uya | H01L 27/14623 257/431 |
| 7,110,034 B2* | 9/2006 | Suda | H01L 27/14603 257/294 |
| 7,142,243 B2* | 11/2006 | Dobashi | H04N 5/2254 348/340 |
| 7,250,973 B2* | 7/2007 | Dobashi | H01L 27/14621 348/336 |
| 7,259,791 B2 | 8/2007 | Fukusho et al. | |
| 7,297,916 B1* | 11/2007 | Feng | H01L 27/14627 250/208.1 |
| 7,443,005 B2* | 10/2008 | Kuo | H01L 27/14621 257/432 |
| 7,453,130 B2 | 11/2008 | Nakai | |
| 7,589,306 B2* | 9/2009 | Venezia | H01L 27/14625 250/208.1 |
| 2001/0010952 A1* | 8/2001 | Abramovich | H01L 27/14601 438/151 |
| 2002/0063214 A1* | 5/2002 | Hsiao | G01J 5/08 250/338.4 |
| 2003/0132429 A1* | 7/2003 | Kim | H01L 21/76897 257/1 |
| 2004/0012707 A1* | 1/2004 | Fukusho | H01L 27/1462 348/340 |
| 2004/0140564 A1* | 7/2004 | Lee | H01L 21/76801 257/758 |
| 2004/0180461 A1* | 9/2004 | Yaung | H01L 27/14685 438/48 |
| 2004/0183086 A1* | 9/2004 | Nakai | H01L 27/14625 257/98 |
| 2004/0195595 A1* | 10/2004 | Rhodes | H01L 21/76819 257/214 |
| 2005/0007669 A1* | 1/2005 | Sakai | B29D 11/00365 359/619 |
| 2005/0045927 A1* | 3/2005 | Li | H01L 27/14627 257/294 |
| 2005/0045975 A1* | 3/2005 | Kondo | H01L 27/14618 257/414 |
| 2005/0073603 A1* | 4/2005 | Feldman | H04N 5/335 348/340 |
| 2005/0162539 A1* | 7/2005 | Brady | H04N 5/2254 348/340 |
| 2005/0242271 A1* | 11/2005 | Weng | H01L 27/14621 250/214.1 |
| 2006/0061674 A1* | 3/2006 | Iida | H01L 27/14621 348/308 |
| 2006/0151818 A1* | 7/2006 | Toumiya | H01L 27/14627 257/294 |
| 2006/0169870 A1* | 8/2006 | Silsby | H01L 27/14625 250/208.1 |
| 2006/0221800 A1* | 10/2006 | Takahashi | H01L 27/14627 369/120 |
| 2006/0268143 A1* | 11/2006 | Boettiger | C23C 4/12 348/340 |
| 2007/0114622 A1* | 5/2007 | Adkisson | H01L 21/76819 257/414 |
| 2007/0242370 A1* | 10/2007 | Fukuta | G02B 9/34 359/773 |
| 2007/0291156 A1* | 12/2007 | Dunne | H01L 27/14618 348/340 |
| 2008/0020299 A1* | 1/2008 | Lee | B29D 11/00365 430/5 |
| 2008/0042177 A1* | 2/2008 | Park | H01L 27/14625 257/294 |
| 2008/0087921 A1* | 4/2008 | Yu | H01L 27/14627 257/213 |
| 2009/0230394 A1* | 9/2009 | Nagaraja | H01L 27/14621 257/59 |
| 2009/0242948 A1* | 10/2009 | Barrett | H01L 27/14685 257/291 |
| 2009/0244347 A1* | 10/2009 | Vaillant | H01L 27/14685 348/308 |

* cited by examiner

«IMAGE SENSOR INCLUDING MULTIPLE LENSES AND METHOD OF MANUFACTURE THEREOF»

CROSS-REFERENCE

The present application is a divisional of application Ser. No. 14/087,370, filed Nov. 22, 2013, which is in turn a continuation of application Ser. No. 10/939,894 filed Sep. 13, 2004, now abandoned, each of which are incorporated herein by reference in their entirety.

FIELD OF DISCLOSURE

The present disclosure relates generally to the field of microelectronic devices and, more particularly, an image sensor including multiple lenses and method of manufacture thereof.

BACKGROUND

Various digital imaging devices (e.g., digital cameras) use image sensors, such as charge-coupled device ("CCD") imaging sensors and complementary metal oxide semiconductor ("CMOS") image sensors. Such image sensors include a two dimensional array of photo receptor devices (e.g., photodiodes), each of which is capable of converting a portion of an image to an electronic signal (e.g., representing a "pixel"). Some devices (e.g., a display device) are capable of receiving one or more signals from multiple photo-receptor devices of an image sensor and forming (e.g., reconstructing) a representation of the image.

A photo-receptor device stores a signal in response to intensity or brightness of light associated with an image. Thus, for an image sensor, sensitivity to light is important.

Accordingly, what is needed is an image sensor with improved sensitivity to light.

BRIEF DESCRIPTION OF THE DRAWINGS

In the accompanying figures, in accordance with the standard practice of the industry, various features are not drawn to scale. In fact, dimensions of the various features may be shown to have increased or reduced for clarity.

DETAILED DESCRIPTION

Figure 1:
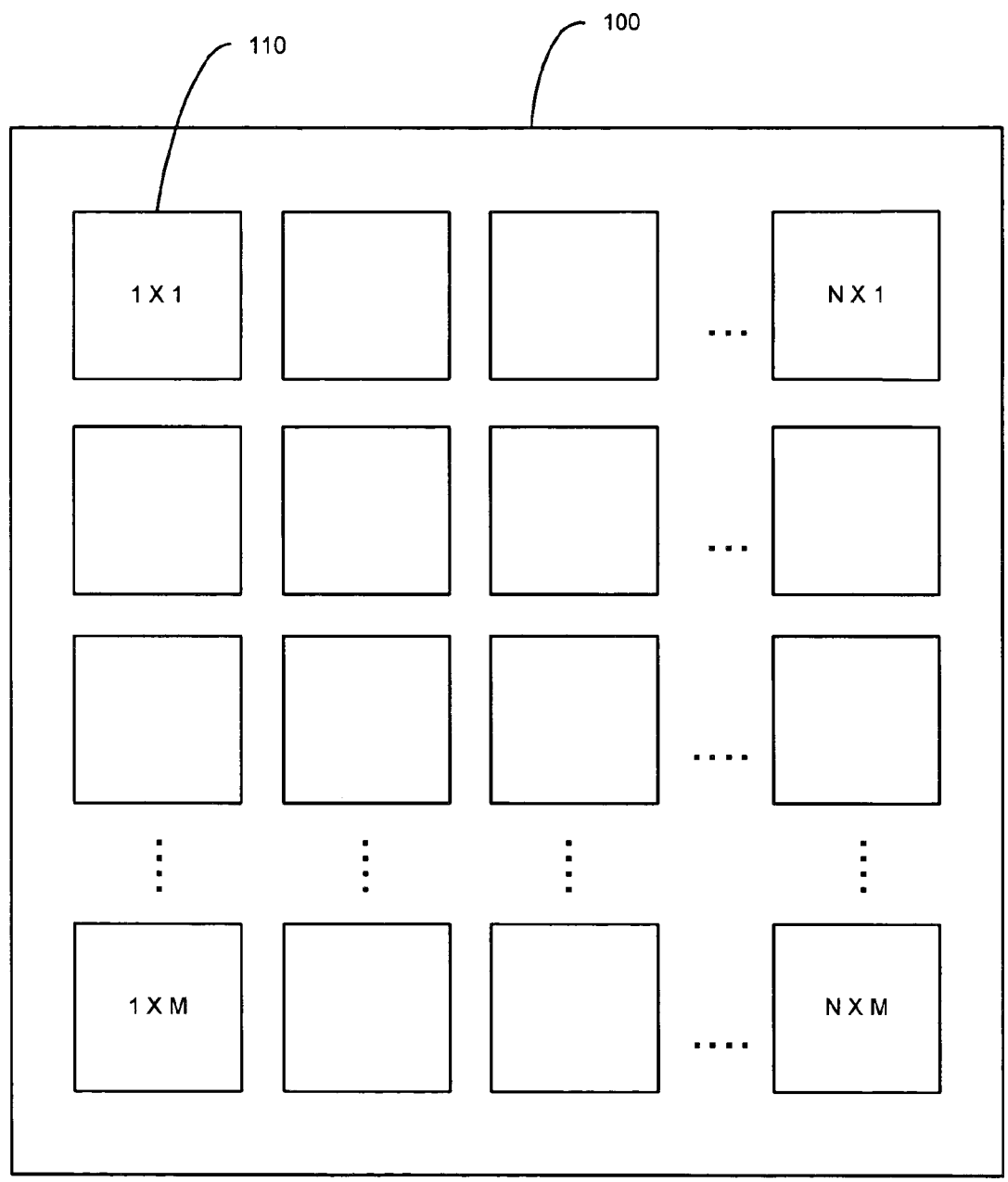
FIG. 1 is a block diagram of an image sensor according to the illustrative embodiment.

The following discussion references various embodiments, and/or examples for implementing different features of the various embodiments. Also, specific examples of components and arrangements are described for clarity, and are not intended to limit the scope this disclosure. Moreover, the following discussions repeat reference numerals and/or letters in the various examples, and such repetitions are also for clarity and does not itself indicate a relationship between the various embodiments and/or configurations discussed. Still further, references indicating formation of a first feature over or on a second feature include embodiments in which the features are formed in direct contact, and also embodiments in which one or more additional features are formed, interposing the first and second features, such that the first feature and the second feature are not in direct contact.

FIG. 1 is a block diagram of an image sensor 100 according to the illustrative embodiment. In the illustrative embodiment, the image sensor 100 is a charged coupled device ("CCD") image sensor. However in other embodiments, the image sensor 100 is another type of image sensor, such as a complementary metal oxide semiconductor ("CMOS") image sensor.

The image sensor 100 includes photo-receptor devices (e.g., photodiodes) 110. Each of the photo-receptor devices 110 is substantially similar to one another. The photo-receptor devices 110 are organized according to a two dimensional array. As shown, the array includes N columns and M rows. Accordingly, the quantity of photo-receptor devices 110 included by the image sensor 100 is represented by a number resulting from multiplying N by M. Information (e.g., electronic signal) stored by each of the photo-receptor devices 110 is capable of representing a "pixel" of an image (e.g., an image displayed by a display device). Thus, the number resulting from multiplying N by M is also capable of representing a resolution (e.g., screen resolution) for such an image.

Figure 2:
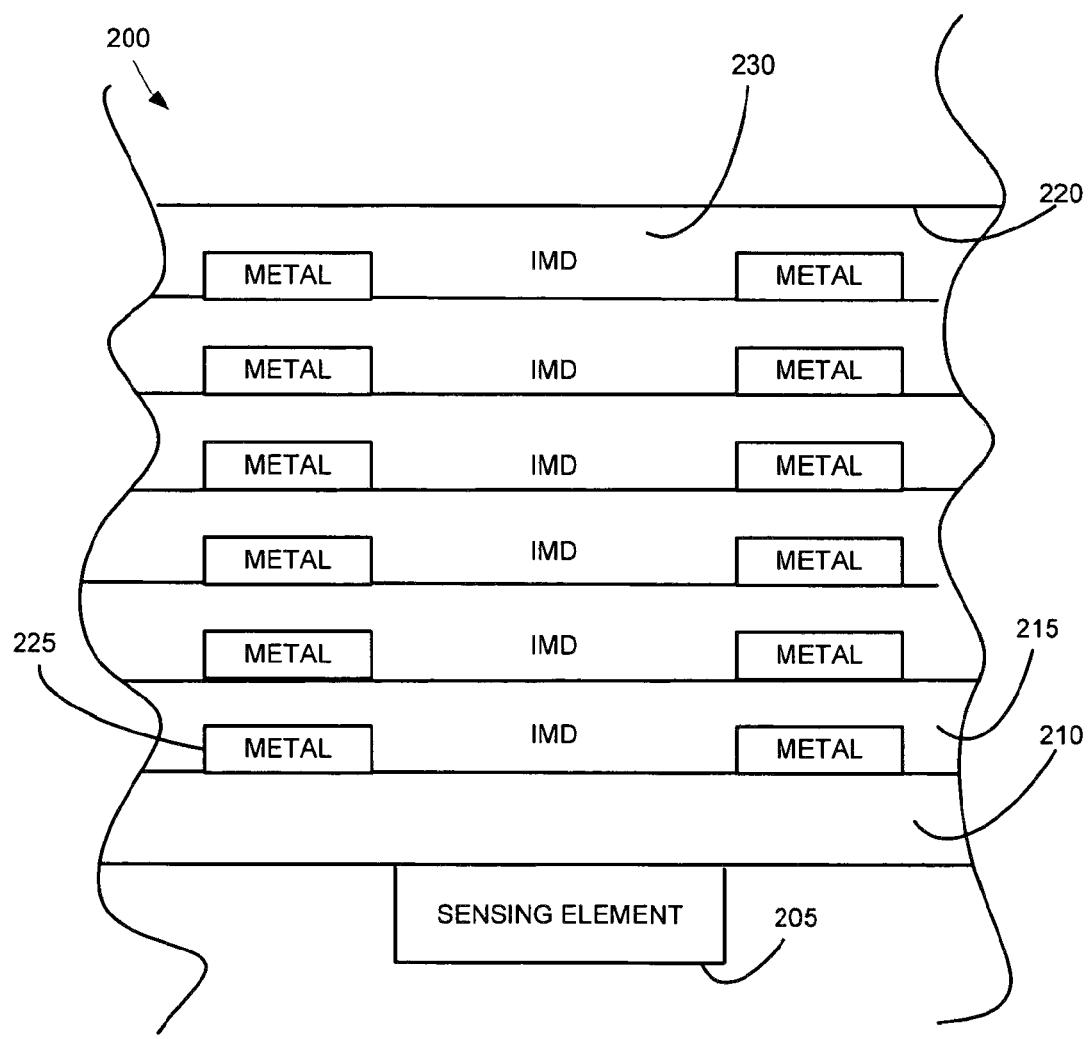
FIGS. 2-4 are successive sectional views of a photo-receptor device according to the illustrative embodiment.

FIG. 2 is a sectional view of a photo-receptor device (e.g., one of the photo-receptor devices 110), indicated generally at 200, in an initial stage of manufacture according to the illustrative embodiment. The photo-receptor device 200 includes a sensing element 205 that reacts to light (e.g., a light beam). In one embodiment, the sensing element 205 includes a pn-junction device (e.g., a diode). The photo-receptor device 200 also includes at least one dielectric layer 210, and one or more inter-metal-dielectric ("IMD") layers 215. Moreover, the photo-receptor device 200 includes a "top" (e.g., upper most) IMD layer 220, which is one of the layers included by the IMD layers 215. Each of the IMD layers 215 includes a metal layer 225 as shown. Also, each of the IMD layers 215 includes a dielectric layer. For example, the IMD layer 220 includes a dielectric layer 230, which is a part of the IMD layer 220.

In the illustrative embodiment, the dielectric layer 230 includes $SiO_2$. The dielectric layer 230 is formed by atomic layer deposition ("ALD"), chemical vapor deposition ("CVD"), such as plasma-enhanced CVD ("PECVD"), high density plasma CVD ("HDP-CVD"), and low pressure CVD ("LPCVD"), evaporation, or any other suitable technique. Notably, with PECVD, tetraethoxysilane ("TEOS") is used to form the $SiO_2$ dielectric layer 230.

After its formation, the dielectric layer 230 is planarized. Examples of planarizing techniques include thermal flow, sacrificial resist etch-back, spin-on glass, and chemical-mechanical planarization ("CMP"). In particular, CMP is a technique for planarizing various disparate types of materials, such as dielectric and metal materials. CMP is capable of selectively removing materials from a layer (e.g., a layer of a wafer) by mechanical polishing that is assisted by one or more chemical reactions.

In more detail, with conventional CMP, a wafer is mounted with its face down on a carrier. The carrier is pressed against a moving platen that includes a polishing surface (e.g., a polishing pad). While the carrier is rotated about its axis, aqueous material including abrasive elements is dripped onto the polishing pad so that the centrifugal force formed by rotating the carrier distributes the aqueous material on the polishing pad. Accordingly, via a combination of mechanical polishing and chemical reaction, CMP selectively removes a portion of a layer of the wafer.

Figure 3:
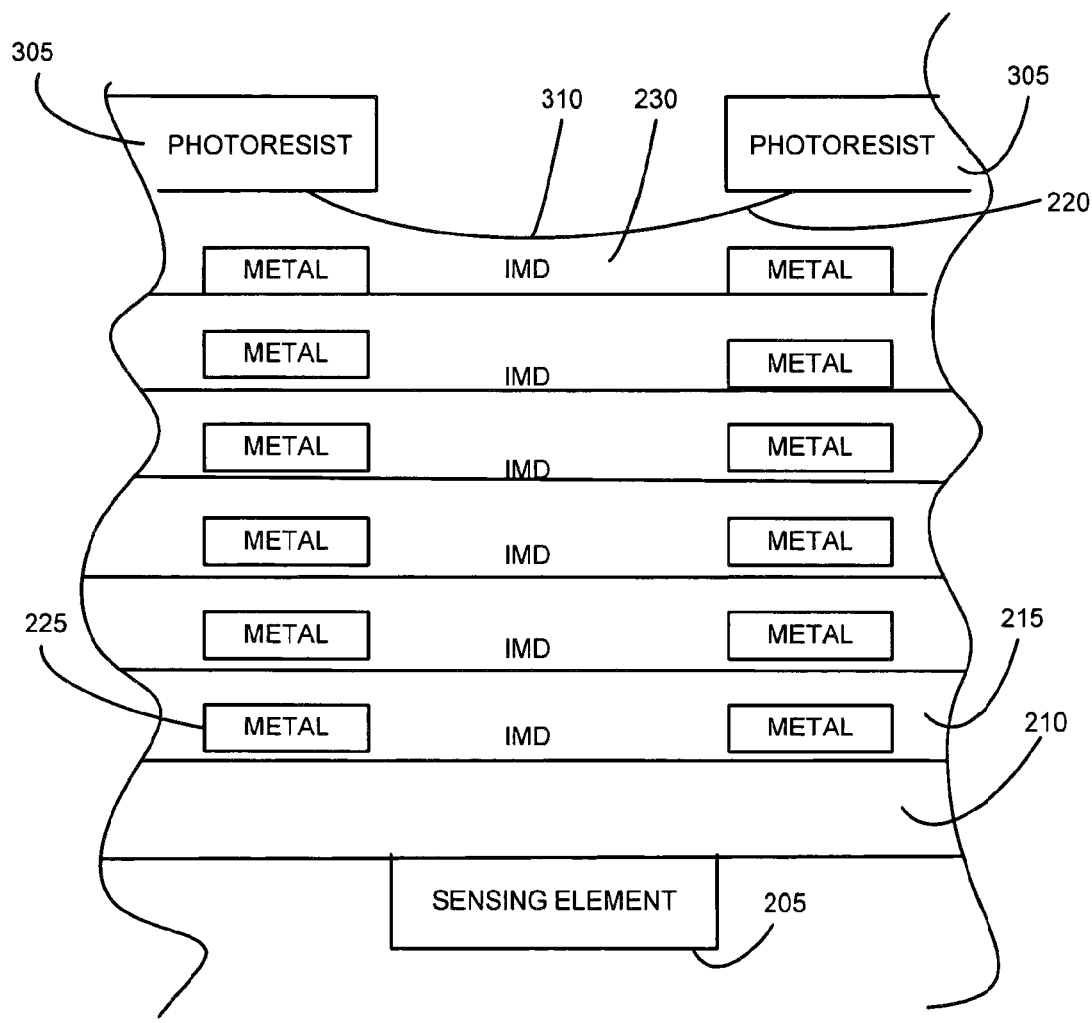

FIG. 3 is a sectional view of the of the photo-receptor device 200, in a subsequent stage of manufacture according to the illustrative embodiment. At this stage, a curved recess 310 is formed on the dielectric layer 230. The curved recess 310 is formed by using conventional photo-lithography and etching techniques. In one example, the curved recess is formed by patterning the dielectric layer 230 with a sequence of processes that includes: photo-resist patterning, wet etching, and photo-resist stripping. Also, the photo-resist patterning includes: photo-resist coating, "soft baking", mask alignment, pattern exposure, photo-resist development, and "hard baking". Moreover, wet etching is isotropic etching, and accordingly, suitable for forming the curved recess 310.

In more detail, in forming the curved recess 310, a photo-resist layer 305 is formed over the dielectric layer 230 as shown in FIG. 3. After forming the photo-resist layer 305, wet etching is performed on the dielectric layer 230. Subsequently, the photo-resist layer 305 is removed. Although in the illustrative embodiment, the curved recess 310 is formed using photo-lithography/wet-etching, in other embodiments, the curved recess 310 is formed using one or more other suitable techniques such as maskless lithography.

Figure 4:
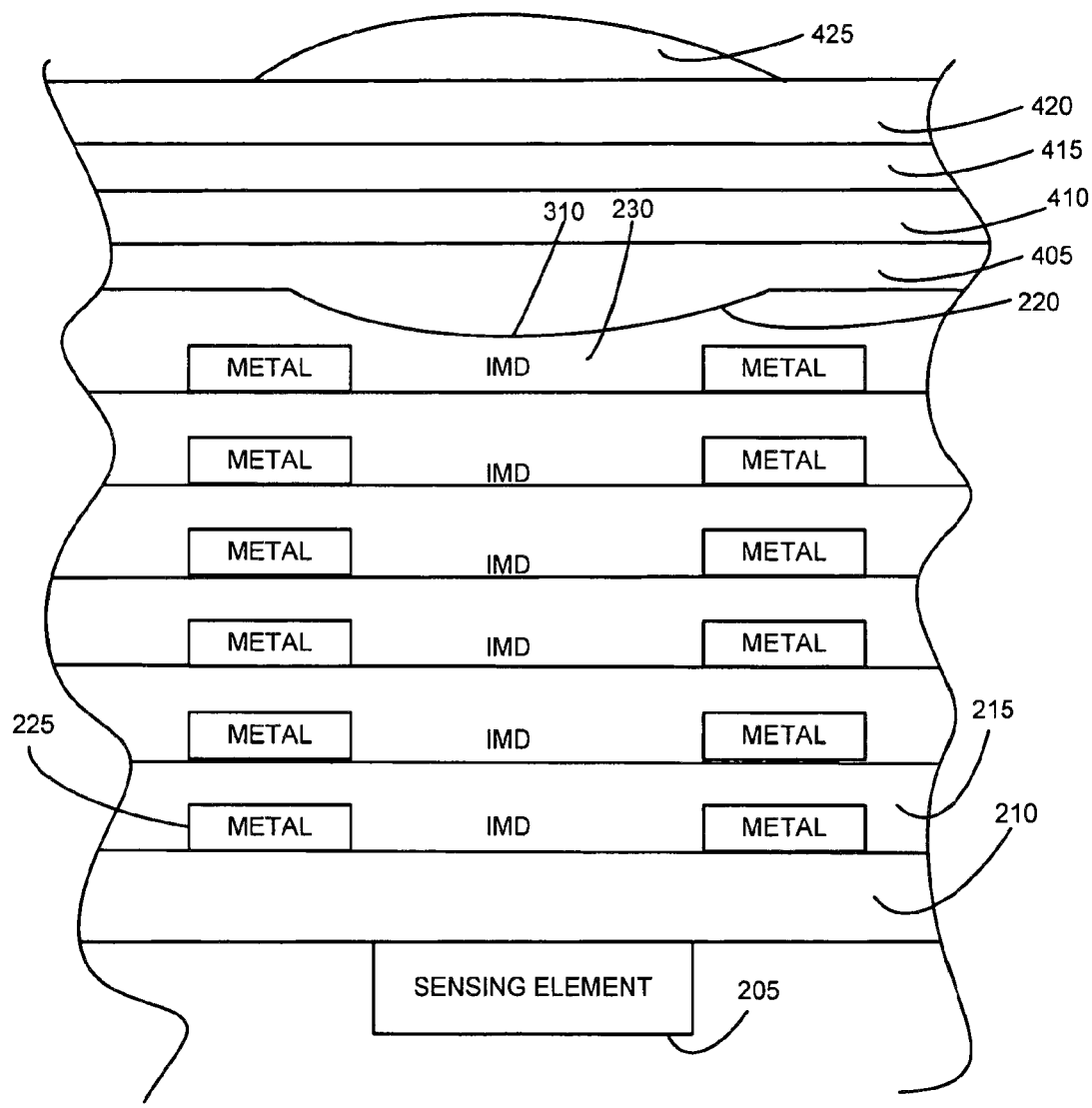

FIG. 4 is a sectional view of the of the photo-receptor device 200, in a subsequent stage of manufacture according to the illustrative embodiment. At this stage of manufacture, the photo-receptor device 200 includes the dielectric layer 230, which includes the curved recess 310. Over the dielectric layer 230 and its curved recess 310, a lens 405 is formed. In the illustrative embodiment, the lens 405 includes SiN, SiON, or any other suitable material. Also, examples of techniques used to form the lens 405 include ion implantation of N, sputtering, ALD, and CVD such as PECVD, LPCVD, and HDP-CVD. In one example, NH3 and HCD are used in association with LPCVD to form the lens 405 that includes SiN. As shown, the lens 405 is a convex lens.

The photo-receptor device 200 also includes a spacer 410, which is formed over the lens 405. In the illustrative embodiment, the spacer 410 includes SiO2, polymer or any other material suitable for electrical insulation and planarization. Moreover, the photo-receptor device 200 includes a color filter layer 415 formed over the spacer 410. In the illustrative embodiment, the color filter layer 415 includes a resin, such as a pigment-dispersed resin or polymer. A spacer 420, which is substantially similar to the spacer 410, is formed over the color filter layer 415 as shown in FIG. 4.

In addition to the lens 405, the photo-receptor device 200 includes a lens 425. The lens 425 is substantially similar to the lens 405. Accordingly, techniques used to form the lens 425 are substantially similar to the techniques used for forming the lens 405 as discussed above. Materials used to form lens 425 include a resin, such as a pigment-dispersed resin or polymer. The various layers between the lens 425 and the sensing element 205 are sufficiently transparent to pass light from lens 425 to the sensing element 205.

As discussed above, the photo-receptor device 200 is capable of forming (e.g., converting) a portion of an image as an electronic signal. The photo-receptor device 200 forms such electronic signal in response to light (e.g., a light beam), from an optical image, that is received through the lenses 405 and 425, the color filter layer 415, and the IMD layers 215.

A light beam passing from one type of medium (e.g., the lens 405) to another medium (e.g., the dielectric layer 230) is typically affected by refraction. An example of refraction can be observed when a light beam passes from air to water. An amount of refraction for a specified medium is characterized by its index of refraction. In one example, index of refraction is characterized by the following mathematical expression.

$$n = c/v_{phase}$$

In the above expression, c is the speed of light and $v_{phase}$ is the phase velocity.

As discussed above, for the photo-receptor device 200, light sensitivity of the image sensing element 205 is important. It has been observed that, in general, light sensitivity can be improved by receiving light from a large pixel area and focusing the light on a small image sensing element. For improving the light sensitivity of the image sensing element 205, the photo-receptor device 200 includes the lenses 405 and 425 as discussed above. Also for improving the light sensitivity of the image sensing element 205, an index of refraction for the lens 405 is greater than an index of refraction for the dielectric layer 230.

For example, in one version of the illustrative embodiment, the lens 405 includes SiN and the dielectric layer 230 includes $SiO_2$. According to one measured value, an index of refraction for SiN is approximately 2.01 and an index of refraction for $SiO_2$ is 1.46. Thus, the index of refraction for the lens 405 (2.01) is greater than the index of refraction for the dielectric layer 230 (1.46).

Although illustrative and alternative embodiments have been shown and described, a wide range of modification, change, and substitution is contemplated in the foregoing disclosure and, in some instances, some features of the embodiments may be employed without a corresponding use of other features. Accordingly, broad constructions of the appended claims in manners consistent with the scope of the embodiments disclosed are appropriate.

What is claimed is:
1. A method, comprising:
providing an image sensing element in a substrate, wherein in a cross-section the image sensing element has a region that extends from a first lateral sidewall to an opposing second lateral sidewall;
forming a plurality of inter-metal dielectric (IMD) layers over the substrate, wherein each IMD layer includes a metal layer and a dielectric layer, wherein each metal layer includes a first portion and a second portion coplanar with and spaced from the first portion, the first portions disposed on a first side of the image sensing element and the second portions disposed on an opposing second side of the image sensing element, wherein each of the dielectric layers extend between over the respective first and second portions and over the image sensing element such that no metal layer is disposed over the image sensing element;
forming a top IMD layer of silicon dioxide ($SiO_2$) over the plurality of IMD layers, wherein the forming the top IMD layer includes providing a planar top surface and a planar bottom surface of a top dielectric layer of the top IMD layer over the plurality of IMD layers extending between the first and second portions and over the image sensing element;
removing a top portion of the top IMD layer to transform a region of the planar top surface to a curved recess while maintaining a planar portion of the top IMD layer below the top portion, the bottom portion having a planar bottom surface and the curved recess as an opposing top surface;

forming a lens on the top IMD layer and in the curved recess wherein the forming the lens includes forming a SiN lens including ion implantation of nitrogen (N); and disposing a color filter layer over the lens and the image sensing element, wherein each layer interposing a bottom surface of the lens and the region extending from the first lateral sidewall to the second lateral sidewall is a dielectric composition.

2. The method of claim 1, wherein the forming the lens includes forming the lens directly on the top IMD layer and curved recess.

3. The method of claim 1, wherein the forming the planar top surface of the top IMD layer includes planarizing the dielectric layer of the top IMD layer.

4. The method of claim 3, wherein the planarizing includes performing a CMP process on the top IMD layer.

5. The method of claim 3, wherein the planarizing includes performing a thermal flow process on the top IMD layer.

6. The method of claim 1, wherein the removing the portion of the top IMD layer includes forming a photoresist layer on the top surface of the IMD layer to define an opening.

7. The method of claim 6, further comprising: transforming the region of the planar top surface under the opening to form the curved recess.

8. The method of claim 1, wherein the removing the portion of the top IMD layer includes performing a wet etching process on a region of the planar top surface of the top IMD layer.

9. The method of claim 1, further comprising:
forming a spacer layer over the lens and under the color filter layer.

10. The method of claim 1, further comprising:
forming a second lens over the color filter layer.

11. The method of claim 10, further comprising:
receiving light using the second lens.

12. The method of claim 11, further comprising:
passing the received light through each of dielectric layers of each the plurality of IMD layers to the image sensing element.

13. The method of claim 1, wherein an index of refraction for the lens is greater than an index of refraction for the dielectric layer of the top IMD layer.

14. A method for manufacturing an image sensor, the method comprising:
forming an image sensing element;
forming a first inter-metal dielectric (IMD) layer and a second IMD layer, wherein each of the first and second IMD layers includes a metal layer and a dielectric layer, wherein the dielectric layer of the first and second IMD layers contiguously extends from a first side of the image sensing element to a second side of the image sensing element such that a dielectric material top surface and a dielectric material bottom surface of each of the dielectric layers of the first and second IMD layers is a continuous planar surface that extends from over the first side to over the second side;
over the image sensing element and the first and second IMD layers, depositing a silicon dioxide layer exhibiting a first index of refraction, wherein the deposited silicon dioxide layer has a top surface and an opposing planar bottom surface, the bottom surface interfaces the dielectric layer of the second IMD layer over dielectric layer of the first IMD layer and over the image sensing element;
using a photolithography process to form a recess in the silicon dioxide layer, wherein the recess is disposed within the silicon dioxide layer;
forming a first lens exhibiting a second index of refraction greater than the first index of refraction, wherein the first lens has a concave profile defined by the recess in the silicon dioxide layer wherein the forming the first lens includes forming a SiN lens including ion implantation of nitrogen (N);
providing a color filter over the first lens; and
forming a second lens over the color filter.

15. A method, comprising:
providing an image sensing element in a semiconductor substrate, wherein the image sensing element has a first sidewall and an opposing second sidewall within the semiconductor substrate, and wherein a first portion of the image sensing element is defined as extending from the first sidewall to the second sidewall;
forming a first and a second inter-metal dielectric (IMD) layers over the substrate, wherein each of the first and second IMD layers includes a metal layer and a dielectric layer, wherein each metal layer is spaced a lateral distance from the first portion of the image sensing element and each dielectric layer extends directly over the first portion of the image sensing element;
forming a top IMD layer over the second IMD layer, wherein the top IMD layer includes a metal layer and an overlying silicon dioxide ($SiO_2$) dielectric layer, wherein a first portion of the overlying dielectric layer is disposed over each of the dielectric layers of the first and second IMD layers and the image sensing element;
using a wet etching process, removing a portion of the dielectric layer of the top IMD layer to form a curved recess defined by a curved surface of the dielectric layer;
forming a lens in the curved recess and over the image sensing element wherein the forming the lens includes forming a SiN lens including ion implantation of nitrogen (N); and
passing received radiation through the lens and each of the dielectric layers of the first and second IMD layers, the dielectric layer of the top IMD layer to be incident the first portion of the image sensing element, such that an entirety of a vertical distance defined between the first portion of the image sensing element and the lens comprises dielectric material without a conductive material interposing the vertical distance during the passing the received radiation.

16. The method of claim 15, wherein the removing the portion of the dielectric layer includes:
forming a photoresist masking element on the top IMD layer, wherein the photoresist masking element is directly above the metal layer of the top IMD layer; and
wherein the photoresist masking element provides an opening over the dielectric layer of the top IMD layer.

17. The method of claim 16, further comprising:
performing the wet etch process on the dielectric layer of the top IMD layer while the photoresist masking element is disposed on the top IMD layer.

18. The method of claim 15, further comprising:
performing a planarization process on the top IMD layer prior to the removing the portion of the top IMD layer.

* * * * *